United States Patent [19]

Weise et al.

[11] Patent Number: 5,750,211
[45] Date of Patent: May 12, 1998

[54] PROCESS FOR DEPOSITING A $SIO_x$ FILM HAVING REDUCED INTRINSIC STRESS AND/OR REDUCED HYDROGEN CONTENT

[75] Inventors: Mark Weise; Dean R. Denison, both of San Jose, Calif.

[73] Assignee: LAM Research Corporation, Fremont, Calif.

[21] Appl. No.: 106,768

[22] Filed: Jul. 16, 1993

Related U.S. Application Data

[63] Continuation of Ser. No. 701,749, May 17, 1991, abandoned.

[51] Int. Cl.$^6$ .............................. B05D 3/06; C23C 16/40
[52] U.S. Cl. .......................... 427/579; 427/571; 427/573; 427/574; 427/575; 427/255.3; 438/787; 438/788
[58] Field of Search .......................... 427/38, 39, 255.3, 427/579, 571, 575, 573, 574; 156/643, 646; 437/228; 438/788, 787

[56] References Cited

U.S. PATENT DOCUMENTS

| | | | |
|---|---|---|---|
| 3,655,438 | 4/1972 | Sterling et al. | 117/201 |
| 4,401,054 | 8/1983 | Matsuo et al. | 118/723 |
| 4,481,229 | 11/1984 | Suzuki et al. | 427/38 |
| 4,572,841 | 2/1986 | Kaganowicz et al. | |
| 4,599,135 | 7/1986 | Tsunekawa et al. | |
| 4,614,666 | 9/1986 | Lindenfelser | 427/39 |
| 4,877,641 | 10/1989 | Dory | 427/38 |
| 4,892,753 | 1/1990 | Wang et al. | 427/38 |
| 4,894,352 | 1/1990 | Lane et al. | 437/238 |
| 4,973,381 | 11/1990 | Palmer et al. | 156/643 |
| 5,023,206 | 6/1991 | Freeman | 437/228 |
| 5,108,543 | 4/1992 | Suzuki et al. | |

OTHER PUBLICATIONS

Webb et al, "Silicon dioxide films produced by PECVD of TEOS and TMCTS", Proc. 2nd Intl. ULSI. Sci. Tech. Symp. ECS Proc., 1989, pp. 571–585.

Chang, et al; "Frequency effects and properties of plasma deposited fluorinated silicon"; J. Vac. Sci. Technol. B, 6(2), Mar. 8, 1988, pp. 524–532.

Fujita, et al; "Electrical properties of silicon nitride films plasma–deposited from $SiF_4$,$N_2$, and $H_2$, source gases", Sep. 1, 1985, pp. 426–431, J. Appl. Phys. 57(2).

Livengood, etal; Plasma enhanced chemical vapor deposition of fluorinated silicon nitride using $SiH_4$—$NH_3$—$NF_3$ mixtures; Appl. Phys. Lett., 50(10), Mar. 9, 1987; pp. 560–562.

Livengood, etal; "Structure and optical properties of plasma–deposited fluorinated silicon nitrite thin films"; J. Appl. Phys. 63 (8), Apr. 15, 1988, pp. 2651–2659.

Chang, et al.; "Flourinated chemistry for high–quality, low hydrogen plasma–deposited silicon nitride films"; J. Appl. Phys. 62(4), Aug. 15, 1987, pp. 1406–1415.

Pai, et al; "Material properties of plasma–enhanced chemical vapor deposition fluorinated silicon nitride", J. Appl. Phys. 68(5), Sep. 1, 1990, pp. 2442–2449.

Flamm et al; "A New Chemistry for Low Hydrogen PECVD Silicon Nitride"; Solid State Technologies, Mar. 1987, pp. 43–44.

Ahn, et al.; "Radiation hardened metal–oxide–semiconductor devices with gate dielectrics grown by rapid thermal processing in $O_2$ with diluted $NF_3$," Appl. Phys. Lett. 58(4) Jan. 28, 1991, pp. 425–427.

*Primary Examiner*—Roy V. King
*Attorney, Agent, or Firm*—Burns, Doane, Swecker & Mathis, LLP

[57] ABSTRACT

A process for reducing intrinsic stress and/or hydrogen content of a $SiO_x$ film grown by ECR chemical vapor deposition, wherein a vapor phase etchant is introduced while growing the silicon dioxide film. The presence of the etchant during the plasma deposition process allows for selective removal of high energy silicon dioxide molecules in the growing film thus reducing intrinsic stress within the film. The use of halogen etchants further reduces the amount of hydrogen present as hydroxyl within the film.

29 Claims, No Drawings

PROCESS FOR DEPOSITING A SIO$_x$ FILM HAVING REDUCED INTRINSIC STRESS AND/OR REDUCED HYDROGEN CONTENT

This application is a continuation of application Ser. No. 07/701,749, filed May 17, 1991 now abandoned.

BACKGROUND OF THE INVENTION

1. Field of the Invention

The present invention relates generally to plasma-enhanced chemical vapor deposition (PECVD) processes, and more particularly to a PECVD process for growing silicon dioxide on a substrate surface wherein the surface is simultaneously etched such that the grown silicon dioxide layer has a reduced level of intrinsic stress and/or a reduced hydrogen content.

2. Description of Related Technology

Chemical vapor deposition (CVD) is a process for forming a material layer by the reaction of gas phase reactants at or near a substrate surface. Thermal CVD processes typically rely on heating of the surface in order to promote the reaction(s) which result in formation of compound(s) on the substrate surface. A problem with thermal CVD processes is that the thermal reaction occurs at high temperatures thus requiring heat resistant substrates and it is difficult to control characteristics of the film such as internal stress. Depending on the nature of the deposited material, the surface temperature required for deposition may be as high as about 1000° C. Under a variety of circumstances, it would be desirable to be able to perform such CVD processes at lower temperatures.

In order to reduce the required surface temperatures, a variation of CVD referred to as plasma-enhanced CVD (PECVD) is employed. In PECVD, a radio frequency (RF) discharge converts the gas phase reactants to more reactive free radical species resulting in a plasma. The higher reactivity of the free radical species reduces the energy required for reaction and thus lowers the substrate surface temperature which is necessary to carry out the process. In particular, the specimen chamber includes a radio frequency electrode arranged opposite to the specimen table. Gas is introduced into the specimen chamber which is typically at a pressure of 0.1 to 10 Torr and radio frequency power is supplied to the specimen chamber to produce plasma. To grow a film of silicon nitride, gaseous molecules of SiH$_4$ and NH$_3$ can be dissociated into plasma and silicon nitride can be grown on a surface of a specimen substrate on a specimen table heated to 300°–500° C. However, dissociation of SiH$_4$ and NH$_3$ may not be sufficiently achieved, H may undesirably be incorporated into the silicon nitride film and/or the Si—N bond may not be sufficiently achieved.

In a particular form of PECVD, referred to as electron cyclotron resonance (ECR) CVD, the plasma is established in a separate plasma chamber by the application of microwave energy to reactant molecules maintained within a magnetic field. In an ECR CVD apparatus, plasma is generated by a microwave discharge through electron cyclotron resonance and a thin film can be formed on a specimen surface with the aid of a divergent magnetic field. In this case, molecules in the plasma are activated and reacted on a specimen substrate to form the thin film. The apparatus includes a specimen chamber in which a specimen table is located, a plasma formation chamber separated from the specimen chamber, a microwave introducing window at one end of the plasma chamber and a plasma extracting orifice at the other end of the plasma chamber facing the specimen chamber. A magnetic circuit at the periphery of the plasma formation chamber forms a magnetic flux density necessary to produce ECR. The divergent magnetic field reduces in intensity in a direction towards the specimen chamber. The plasma formation chamber can have a shape and dimensions suitable for forming a microwave cavity resonator and gases can be supplied to the plasma formation and specimen chambers.

Of particular concern to the present invention, PECVD and ECR CVD processes (also referred to hereinafter as plasma CVD processes) may be used for growing silicon dioxide on substrate surfaces, particularly over semiconductor wafers where the silicon dioxide usually forms a dielectric layer between adjacent metallization layers. The use of aluminum in the metallization layers greatly limits the maximum temperature to which the wafers can be exposed. Plasma CVD allows lower processing temperatures to be used compared to thermal CVD processes.

Plasma CVD processes for growing silicon dioxide are very useful because of their low temperature characteristics. However, there are certain limitations on growing silicon dioxide by plasma CVD compared to thermal CVD silicon dioxide deposition. Plasma CVD silicon dioxide films are usually less stable than thermal CVD silicon dioxide films, i.e., the atoms in the plasma CVD films will be present in higher free energy configurations than in the thermal CVD films. Such "high stress" films are undesirable since they can cause wafer deformation, i.e., bowing, which adversely affects subsequent processing steps. Also, plasma CVD silicon dioxide films will typically have higher levels of incorporated hydrogen (as hydroxyl) when hydrogen is present in one of the reactant gases compared to thermal CVD films. Higher hydrogen incorporation is undesirable because it is associated with poor film properties and a high dielectric constant.

The level of stress in plasma CVD films can be reduced by RF sputtering which appears to preferentially remove those atoms in the film that are bound in higher free energy states (least strongly bound) and thus contribute to film stress. Such sputtering, however, cannot be adjusted independently of other process parameters to reduce stress to optimally low levels. Moreover, such sputtering has no significant effect on lowering hydrogen incorporation into the silicon dioxide films.

PECVD processes for growing silicon nitride using feed mixtures containing nitrogen trifluoride (NF$_3$), silane (SiH$_4$), and nitrogen gas (N$_2$) are described in publications such as Chorng-Ping et al. (1988), Journal of Vacuum Science and Technology B, Vol. 6, No. 2, pp. 524–532; Flamm et al. (1987), Solid State Technology, March, pp. 43–44; Fujita et al. (1985), J. Appl. Phys. 57:426–432; Livengood and Hess (1987) Appl. Phys. Lett. 50:560–562; Livengood et al. (1988), J. Appl. Phys. 63:2651–2659; Chang et al. (1987), J. Appl. Phys. 62:1406 et seq.; and Pai et al. (1990), J. Appl. Phys. 68:2442–2449. These processes generally result in the deposition of fluorinated silicon nitride.

Processes for periodically plasma etching a growing PECVD film have been proposed. The etching step(s) would be performed only after the PECVD process has been stopped and the deposition reactants removed.

U.S. Patent No. 4,401,054 ("Matsuo") discloses an ECR CVD apparatus wherein gaseous material and microwave power are introduced into a plasma formation chamber to generate plasma by microwave discharge through electron cyclotron resonance. Matsuo discloses that the apparatus can be used to form a thin film of Si, Si$_3$N$_4$, SiO$_2$, MoSi2 and WSi$_2$.

Matsuo discloses several ECR CVD processes for forming thin film. For instance, a $Si_3N_4$ film can be formed by introducing $N_2$ into the plasma formation chamber and $SiH_4$ into the specimen chamber. Instead of introducing only $N_2$ into the plasma formation chamber, Ar can be introduced to form a Si film or a mixture of Ar+20% $N_2$ can be introduced to form a $Si_3N_4$ film. A $SiO_2$ film can be formed by introducing $O_2$ into the plasma formation chamber and $SiH_4$ into the specimen chamber. Phosphorus-silicate glass ("PSG") films can be formed by introducing $O_2$ into the plasma formation chamber and $SiH_4+PH_3$ into the specimen chamber. Molybdenum silicide ($MoSi_2$) films can be formed by introducing $MoF_6$ into the plasma formation chamber and $SiH_4$ into the specimen chamber. Matsuo also discloses that the ECR CVD apparatus can also be used for plasma etching by introducing gases such as $CF_4$.

U.S. Pat. No. 4,481,229 ("Suzuki") discloses a method of growing a silicon-including film by using a halogenide silicon gas. Suzuki discloses that when Si—N or a-Si films are formed in conventional CVD apparatus of the D.C. glow discharge type and RF discharge type, hydrogen is contained in the deposited film. However, to avoid hydrogen in the Si including film, halogenide silicon gas such as $SiF_4$, $SiCl_4$, $SiFCl_3$, $SiF_3Cl$ and $SiBr_4$ can be used as the silicon-supplying gas instead of $SiH_4$. A problem with using such halogenide silicon gases is that the desired film is not deposited. Instead, a silicon wafer used as the substrate is etched. One reason for this is that the operating gas pressure is higher than $10^{-2}$ Torr, the electron temperature of discharge is low (about 4 eV) and the bonding energy of the halogenide gas Si—F (Q=115 kcal/mol) or Si—Cl (Q=67.8 kcal/mol) is greater than that of Si—H (Q=53.7 kcal/mol). Thus, the halogenide silicon gas is not fully decomposed. In addition, in the case of the RF discharge type apparatus, the film deposited on the surface is sputtered or decomposed by the incident ions thus preventing the film from growing.

Suzuki discloses that a hydrogen-free silicon-including film can be grown by ECR CVD using a halogenide silicon gas alone or in a gas mixture. Suzuki's apparatus includes a round waveguide, a discharge tube, a solenoid coil for forming a magnetic field in a vacuum chamber which includes the inside of the discharge tube and a specimen chamber, a permanent magnet outside the specimen chamber but below a substrate table in the specimen chamber aligned with the discharge tube, and gas inlets in the substrate chamber. The discharge tube is made of an insulator (such as quartz or alumina) capable of transmitting the microwave and the strength of the magnetic field in the discharge tube decreases in a direction towards the substrate surface. The permanent magnet gathers the lines of magnetic force together at the substrate surface.

Suzuki forms a $Si_3N_4$ hydrogen-free film by introducing non-hydrogen containing gases such as $SiF_4$ and $N_2$ in a ratio of 1:1 into the vacuum chamber. Suzuki discloses that $NF_3$ can be used as the nitrogen-containing gas. To produce an a-Si film, $SiF_4$ is used as the discharge gas. Suzuki discloses that a silicon-containing film can also be grown using $SiCl_4$, $SiF_nCl_m$ (n+m=4) or $Si_xF_yCl_z$ (x≧2).

U.S. Pat. No. 4,973,381 ("Palmer") discloses a method of plasma etching wherein excited gas contacts the surface to be etched and excited electrons in the gas molecules tend to remix with molecules of the surface material to form volatile compounds which are then removed by vacuum pumps. Palmer discloses that the active species of the gas can be a halogenated gas such as $CCl_4$ or a mixture of $CCl_4$ and $O_2$. Other active species include O, OH, F, CO, CF, Cl, $F_2$, CCl, $CF_2$, $Cl_2$ and Br. Buffer gases which change the distance the reactant travels in Palmer's apparatus prior to recombination include helium, argon and nitrogen.

There is a need in the art for plasma CVD processes for growing films such as silicon dioxide over semiconductors and other substrate surfaces to provide layers having reduced intrinsic stress and reduced levels of incorporated hydrogen in the form of hydroxyl.

SUMMARY OF THE INVENTION

The invention provides a process for growing a $SiO_x$ film having reduced intrinsic stress by providing a substrate in a reaction zone, simultaneously introducing different first and second gases into the reaction zone, growing a film comprising atoms in ordered and disordered crystallographic states on the substrate by decomposing the first gas and reacting the decomposed gas on a surface of the substrate, and reducing intrinsic stress in the film by removing atoms from the film in the disordered crystallographic state. The disordered atoms are removed by reacting a chemically active species of the second gas with the disordered atoms and the film growing and intrinsic stress reducing steps are performed simultaneously.

The invention also provides a process for growing a $SiO_x$ film having reduced hydrogen content by providing a substrate in a reaction zone, simultaneously introducing different first and second gases into the reaction zone, at least one of the first and second gases containing hydrogen, growing a film on the substrate by decomposing the first gas and reacting the decomposed gas with the substrate, the growing film including hydrogen atoms therein, and removing hydrogen atoms from the film by reacting the growing film with a chemically active species in the second gas, the film growing and hydrogen removing steps being performed simultaneously.

The process can include introducing a third gas into the reaction zone, the third gas being decomposed along with the first gas during the film growing step. The third gas is different from the first and second gases and the film comprises a compound of elements removed from the first and third gases. The process is particularly useful in growing a silicon dioxide film on a semiconductor wafer. To grow silicon dioxide, the first gas can comprise a carbon-free silicon containing gas such as $SiH_4$, $Si_2H_6$, $SiF_4$, $Si_2F_6$, $SiCl_4$, and $SiH_2Cl_2$ or organosilanes, the second gas can comprise a carbon-free halogen gas such as $NF_3$, HF, $SF_6$, a carbon-containing halogen gas such as $CF_4$, $C_2F_6$, $C_2Cl_3F_3$, or pure halogengas such as $Br_2$, Cl, $F_2$ and $I_2$ and the third gas can comprise $O_2$, $N_2O$ and $CO_2$. The $SiO_x$ film can also be produced directly from the first gas if the first gas comprises an organosilane.

The film growing, intrinsic stress reducing and hydrogen reducing steps can be performed in a vacuum environment such as a reaction chamber of a plasma enhanced chemical vapor deposition apparatus. The intrinsic stress reducing step can reduce the magnitude of the intrinsic stress in the film to below 200 MPa, preferably below 150 MPa and more preferably below 100 MPa. The hydrogen reducing step can reduce hydrogen in the form of hydroxyl from the film to below 3 at. %, preferably below 2 at. % and more preferably below 1.5 at. %. The intrinsic stress reducing step and/or the hydrogen removing step preferably etches the growing film at a rate of 20 to 90% or 20 to 60% of a rate at which the film grows during the film growing step. The etching rate can be adjusted by controlling the ratios of the gases introduced into the reaction zone.

DESCRIPTION OF THE PREFERRED EMBODIMENTS

The present invention provides an improved process for growing films such as $SiO_x$ films over substrate surfaces.

particularly for the plasma-enhanced CVD (PECVD) and electron cyclotron resonance (ECR) CVD of silicon dioxide on semiconductor wafers during device fabrication procedures. The improvement comprises the combination of plasma-phase chemical etch reaction(s) concurrently with the plasma-phase chemical vapor deposition reaction(s) occurring at or near the substrate surface. It has been found that the chemical etching of certain high free energy, unstable atoms during the deposition process significantly reduces intrinsic stress within the deposited film. Additionally, it has been found that the use of halogen etchants in the deposition process reduces the hydrogen content within the deposited films. Thus, silicon dioxide films are produced which are superior to those obtained without concurrent chemical etching.

Chemical vapor deposition processes are well known in the art. See, for example, Elliot, *Integrated Circuit Fabrication Technology*, McGraw-Hill Book Company, New York, 1982, the disclosure of which is hereby incorporated by reference. Conventional thermal CVD processes rely on heat-induced decomposition of reactant gases to promote the reaction rate of the gases at the substrate surface to produce a desired film. In PECVD, disassociation of the reactant gases can be enhanced by the application of radio frequency (RF) energy to a reaction zone proximate the substrate surface, creating a plasma of highly-reactive ionic species. See, Chapman, *Glow Discharge Processes*, John Wiley and Sons, New York 1980, the disclosure of which is hereby incorporated by reference.

Recently, a variation of PECVD referred to as electron cyclotron resonance (ECR) CVD has been developed wherein dissociation of the reactant gases into a plasma of ions is achieved in a separate plasma chamber by exposure to microwave energy, typically at 2.45 GHz, in the presence of a magnetic field. Electrons are constrained to move in orbits in the magnetic field. The electrons then drift in the direction of the diverging magnetic field which extends toward the substrate. The extraction of the electrons from the plasma chamber via the magnetic field imposes an electrical potential gradient which then draws the ions out of the plasma chamber after the electrons. In the vicinity of the substrate surface, the RF discharge creates a large potential gradient over a short (with respect to the scale of the machine) distance which accelerates the ions perpendicularly towards the substrate. Thus, the ions are only directly affected, to any substantial degree, by the electrostatic fields that exist in the plasma, not by the magnetic or RF fields. By varying the RF power applied to the substrate, the magnitude of the potential gradient and thus the arrival energy of the ions at the substrate surface, can be varied.

ECR CVD has numerous advantages including independent (non-coupled) control over the plasma generation energy and the RF bias energy. Additionally, the shape of the plasma can be modified in a desirable manner by the magnetic field.

The methods of the present invention are particularly advantageous when applied to PECVD and ECR CVD processes. The use of simultaneous etching could also be incorporated in conventional thermal CVD processes as well.

CVD reactors suitable for use in the present invention may be conventional and can include a support surface for one or more substrates, typically semiconductor wafers, and a means for cooling the substrate(s) to below a desired temperature, typically below about 450° C., more typically in the range from about 400° C. to about 250° C. The cooling means may comprise fluid cooling channels formed in the body of the support surface for the wafer. PECVD reactors further include a radio frequency discharge means, typically a pair of electrodes, capable of producing a glow discharge which converts the gaseous reactants and the vapor phase etchants into corresponding free radical species. ECR CVD reactors include an electron cyclotron resonance source for producing the desired reactive plasma species and may include an RF biasing means for accelerating the reactive species towards the wafer.

According to one aspect of the present invention, $SiO_x$ can be formed by the vapor phase (usually plasma phase) reaction of a silicon reactant such as silane ($SiH_4$), disilane ($Si_2H_6$), silicon tetrafluoride ($SiF_4$), silicon hexafluoride ($Si_2F_6$), silicon tetrachloride ($SiCl_4$), silyldichloride ($SiH_2Cl_2$), and commerically available organosilanes such as TEOS (tetraethoxysilane), TOMCATS (2,4,6,8 tetramethylcyclotetrasiloxane), DABS (diacetoxyditertiarybutoxysilane) and the like.

The oxygen reactant can be selected from gases such as molecular oxygen ($O_2$), nitrous oxide ($N_2O$), carbon dioxide ($CO_2$), and the like. The flow rate of the reactants into the reactor will depend primarily on reactor size, deposition rate, number of wafers, and the like. The ratio of silicon reactant to oxygen reactant will typically be in the range from about 5:1 (oxygen:silicon on an atomic basis) to about 2:1, more typically being in the range from about 4:1 to about 3:1. The silicon and oxygen reactants can be introduced as separate gases or as part of the same gas (e.g. organosilane gas).

For PECVD and ECR CVD, the pressure within the reaction zone of the reactor should preferably be maintained substantially below atmospheric, typically being below about 1 Torr, usually below about 100 mTorr, and advantageously being in the range from about 0.5 to 100 mTorr. The pressure can be maintained using conventional rotary and turbomolecular or diffusion pumps in combination with conventional pressure control instrumentation.

In the case of PECVD, radio frequency discharge will be provided in order to induce a glow discharge to maintain the reactant and etchant species in their free radical forms. The radio frequency can typically be applied using internal opposed electrodes operated at a frequency of about 13.56 MHz. The power level may vary from about 0 Watts.$cm^2$ to about 2.5 Watts $cm^2$, typically being in the range from about 1 Watt-$cm^2$ to about 2 Watts.$cm^2$.

In the case of ECR CVD, microwave energy is introduced into the plasma chamber where the conditions for electron cyclotron resonance are met. Typical ECR conditions are a microwave frequency of 2.45 GHz and a magnetic field strength of 875 Gauss. The microwave power levels can typically be in the range from about 0.2 kW to about 5 kW, usually being in the range from about 1 kW to about 3 kW.

As described thus far, process conditions are similar to those employed in conventional PECVD and ECR CVD silicon dioxide deposition. In the present invention, however, the conditions are modified to selectively induce chemical plasma etching of relatively high energy silicon dioxide molecules which if not removed, would increase the intrinsic stress of the deposited film.

As used herein, intrinsic stress is defined as stress inherent in the deposited film, in contrast to film stress which results from differential thermal expansion between the film and substrate. Intrinsic stress is conveniently measured in units of MPa and can be determined by equipment which measures bowing of the wafer caused by stress. Such measurement techniques are well known and the measuring equipment is available from commercial suppliers, such as Flexus, Sunnyvale, Calif.

Chemical etching according to the present invention is carried out concurrently with deposition by introducing a vapor phase chemical etchant to the mixture of reaction gases so that an etching mechanism will occur simultaneously with the silicon dioxide deposition mechanism within the reaction zone. The etchant can be a conventional chemical etchant of the type used for plasma etching of silicon dioxide. The etchant can be further selected so that it will not significantly introduce impurities into the film and will be otherwise compatible with the process characteristics. Suitable etchants for the process of the present invention include halogen etchants, such as nitrogen trifluoride ($NF_3$), HF, $SF_6$, $CF_4$, $C_2F_6$, $C_2Cl_3F_3$, $SF_6$, and the like, as well as pure halogens, such as bromine ($Br_2$), chlorine ($Cl_2$), fluorine ($F_2$), iodine ($I_2$), and the like. The use of $NF_3$ is preferred. The use of pure halogens, however, is not preferred since they expose the deposition equipment to corrosion. Also, sulfur-based and carbon-based etchants, such as $SF_6$, $CF_4$, $C_2F_6$, and the like, are not generally preferred as they can result in undesirably high levels of impurities such as residual carbon or sulfur in the deposited film.

The etchants will be introduced to the reaction zone (or optionally to the plasma chamber in the case of ECR CVD) in an amount sufficient to achieve an appropriate balance between the deposition rate and the etch rate. Typically, higher amounts of etchant results in a lower deposition rate of the $SiO_x$ film. Suitable etch rates can vary from about 20% to about 90% of the deposition rate. For example, the etch rate can be from about 20% to about 60% of the deposition rate. The atomic ratio of fluorine to silicon introduced to the reaction zone can be between about 1:10 to 4:1 (F:Si), usually being between about 1:10 to 2:1 (F:Si).

Use of the halogen etchants according to the present invention has been found to reduce the amount of hydrogen in the form of hydroxyl (OH) which is formed within the deposited silicon dioxide layer. In conventional processes, the amount of hydrogen present as hydroxyl will often exceed 10%, typically being above about 5%. Using the method of the present invention with halogen etchants, the amount of hydrogen in the deposited silicon dioxide layer can be reduced to below about 3 atomic %, frequently being below about 2 atomic %, and often being below about 1.5 atomic %. The amount of hydrogen incorporated in the silicon dioxide film may be measured by conventional methods and equipment, such as those which employ infrared spectroscopy, such as the Bio-Rad FTS-7 analyzer.

Although the invention has been described with reference to the foregoing embodiments, various changes and modifications may be made thereto which fall within the scope of the appended claims.

What is claimed is:

1. An ECR CVD process for growing a $SiO_x$, film having reduced intrinsic stress, comprising the steps of:

providing a substrate in a reaction zone of an ECR CVD reactor;

simultaneously introducing first, second and third gases into the reaction zone, the first gas being a carbon-free silicon containing gas and the third gas consisting essentially of oxygen;

growing the film on the substrate by decomposing the first gas and reacting the decomposed gas on a surface of the substrate, the growing film comprising atoms in ordered and disordered crystallographic states; and reducing intrinsic stress in the film by removing atoms from the growing film in the disordered crystallographic state, the disordered atoms being removed by reacting a chemically active species of the second gas with the growing film, the second gas being a carbon-free halogen containing gas and the film growing and intrinsic stress reducing steps being performed simultaneously, the film growing and intrinsic stress reducing steps being performed under ECR condition in a vacuum environment.

2. The process of claim 1, wherein the first gas is different from the second gas.

3. The process of claim 1, wherein the film consists essentially of silicon dioxide.

4. The process of claim 1, wherein the first gas comprises a gas selected from the group consisting of $SiH_4$, $Si_2H_6$, $SiF_4$, $Si_2F_6$, $SiCl_4$ and $SiH_2Cl_2$.

5. The process of claim 3, wherein the third gas in pure oxygen.

6. The process of claim 1, wherein the second gas comprises a halogen gas selected from the group consisting of $NF_3$, HF, $SF_6Br_2$, $Cl_2$, $F_2$ and $I_2$.

7. The process of claim 1 wherein the vacuum is below 0.05 Torr and the substrate is maintained at a temperature below about 450° C.

8. The process of claim 1, wherein the intrinsic stress reducing step reduces a magnitude of intrinsic stress in the film to no greater than a range of 100 to 200 MPa.

9. The process of claim 1, wherein the second gas comprises a fluorine containing etchant.

10. The process of claim 9, wherein the fluorine-containing etchant is introduced to the reaction zone at an atomic ratio of F:Si of between 1:10 to 4:1.

11. The process of claim 1, wherein the film is deposited on a silicon wafer.

12. The process of claim 11, wherein the silicon wafer includes an exposed metallization layer and the $SiO_x$ film is applied as a dielectric layer on the silicon wafer.

13. The process of claim 1, wherein at least one of the first and second gases contains hydrogen and the intrinsic stress reducing step results in reducing hydrogen content in the film.

14. The process of claim 13, wherein the intrinsic stress reducing step reduces hydrogen in the form of hydroxyl in the film to no greater than a range of 1.5 to 3 at. %.

15. The process of claim 1, wherein the intrinsic stress reducing step etches the film at a rate of 20 to 90% of a rate at which the film is grown during the film growing step.

16. An ECR CVD process for growing a $SiO_x$ film having reduced hydrogen content, comprising the steps of:

providing a substrate in a reaction zone of an ECR CVD reactor;

simultaneously introducing first, second and third gases into the reaction zone, the first gas being a carbon-free silicon containing gas and at least one of the first and second eases containing hydrogen, the third gas consisting essentially of oxygen;

growing the film on the substrate by decomposing the first gas and reacting the decomposed gas on a surface of the substrate, the film including hydrogen atoms therein; and removing the hydrogen atoms from the film by reacting the growing film with a chemically active species in the second gas, the second gas being a carbon-free halogen containing gas and the film growing and hydrogen removing steps being performed simultaneously, the film growing and hydrogen removing steps being performed under ECR condition in a vacuum environment.

17. The process of claim 16, wherein the first gas is different than the second gas.

18. The process of claim 16, wherein the film consists essentially of silicon dioxide.

19. The process of claim 16, wherein the first gas comprises a gas selected from the group consisting of $SiH_4$, $Si_2H_6$, $SiF_4$, $Si_2F_6$, $SiCl_4$ and $SiH_2Cl_2$.

20. The process of claim 18, wherein the third gas is pure oxygen.

21. The process of claim 16, wherein the second gas comprises a halogen gas selected from the group consisting of $NF_3$, HF, $SF_6Br_2$, $Cl_2$, $F_2$ and $I_2$.

22. The process of claim 16, wherein the vacuum is below 0.05 Torr and the substrate is maintained at a temperature below about 450° C.

23. The process of claim 16, wherein the hydrogen removing step reduces a magnitude of intrinsic stress in the film to no greater than a range of 100 to 200 MPa.

24. The process of claim 16, wherein the second gas comprises a fluorine-containing etchant.

25. The process of claim 24, wherein the fluorine-containing etchant is introduced to the reaction zone at an atomic ratio of F:Si of 1:10 to 4:1.

26. The process of claim 18, wherein the film is deposited on a silicon wafer.

27. The process of claim 26, wherein the silicon wafer includes an exposed metallization layer and the $SiO_x$ film is applied as a dielectric layer on the silicon wafer.

28. The process of claim 16, wherein the hydrogen reducing step reduces hydrogen in the form of hydroxyl in the film to no greater than a range of 1.5 to 3 at. %.

29. The process of claim 16, wherein the hydrogen reducing step etches the film at a rate of 20 to 90% of a deposition rate of the film during the film growing step.

* * * * *